United States Patent [19]

MacKinnon et al.

[11] Patent Number: 4,667,174
[45] Date of Patent: May 19, 1987

[54] MAGNET ASSEMBLY FOR MAGNETIC RESONANCE IMAGING AND METHOD OF MANUFACTURE

[75] Inventors: Barry A. MacKinnon; Howard D. Sutphin, both of Sunnyvale, Calif.

[73] Assignee: Resonex, Inc., Sunnyvale, Calif.

[21] Appl. No.: 768,872

[22] Filed: Aug. 23, 1985

[51] Int. Cl.⁴ .............................................. H01F 5/00
[52] U.S. Cl. .................................... 335/299; 324/318; 29/606
[58] Field of Search ............. 335/299, 300; 29/602 R, 29/606, 825, 835; 324/318, 320

[56] References Cited

U.S. PATENT DOCUMENTS 3,161,807  12/1964  Brogan et al. ...................... 335/299
4,095,202   6/1978  Danielsson et al. ................ 335/299

FOREIGN PATENT DOCUMENTS 2551258  3/1985  France ............................... 335/299

*Primary Examiner*—George Harris
*Attorney, Agent, or Firm*—Flehr, Hohbach, Test, Albritton & Herbert

[57] ABSTRACT

Magnet assembly having a magnet yoke formed of a magnet material and providing a generally rectangular opening and having first and second spaced apart parallel pole faces which are facing each other. First and second coil assemblies are disposed in the opening in the yoke. Each coil assembly comprises first and second spaced apart generally parallel bundles of nested U-shaped members formed of conducting material. The bundles have legs at opposite ends. First and second sets of cross pieces are bonded to the legs of the U-shaped members. Insulating material is disposed between the U-shaped members and the cross pieces so that the bonded together U-shaped members and the cross pieces form a continuous current conductor for each coil assembly.

8 Claims, 5 Drawing Figures

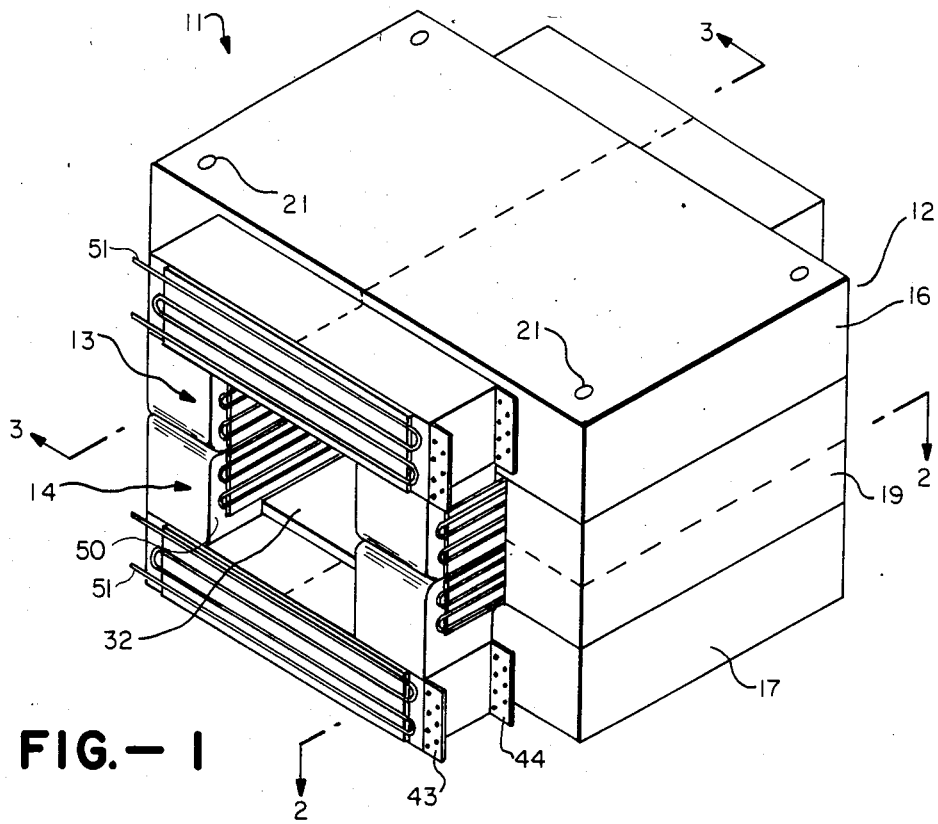
FIG.—1
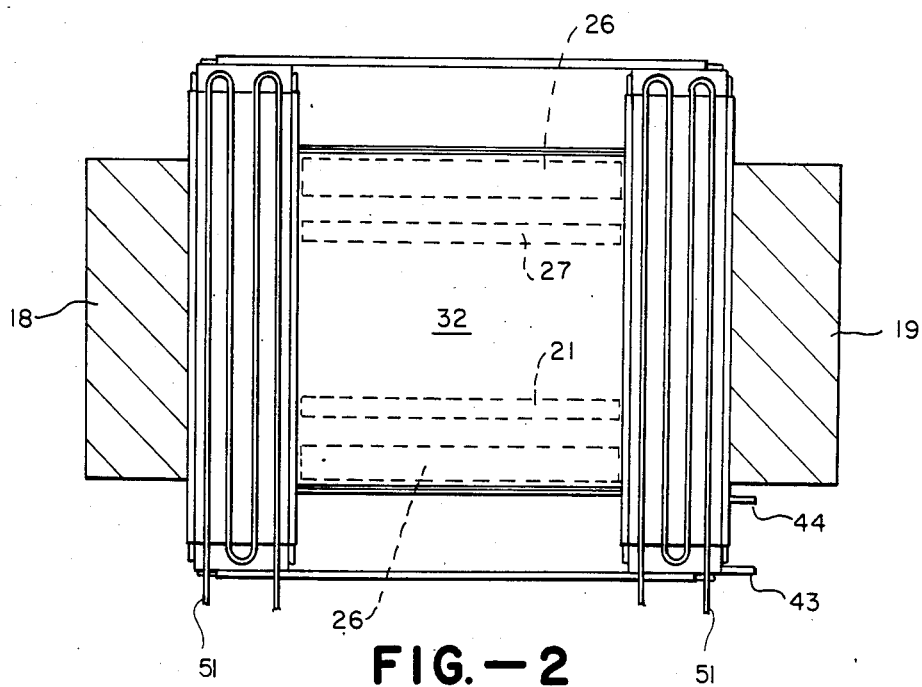
FIG.—2

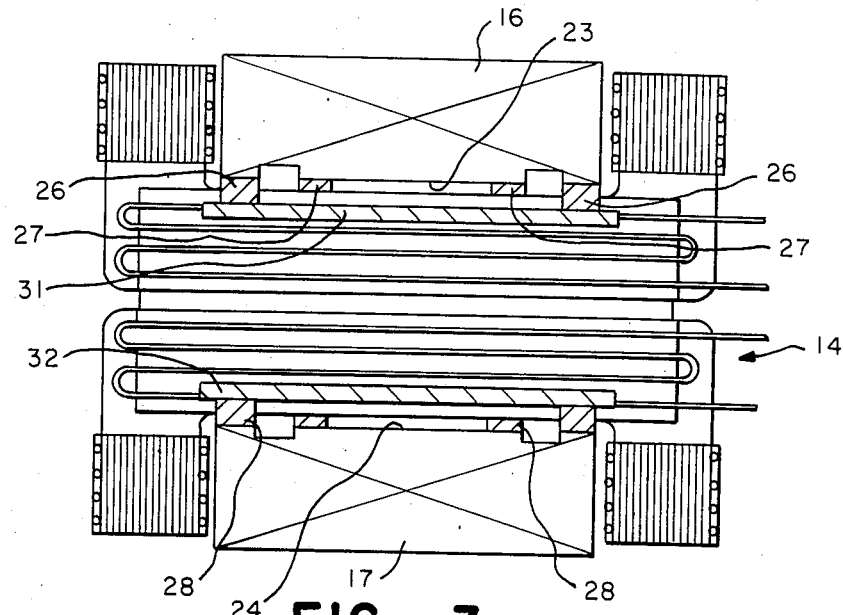
FIG.—3
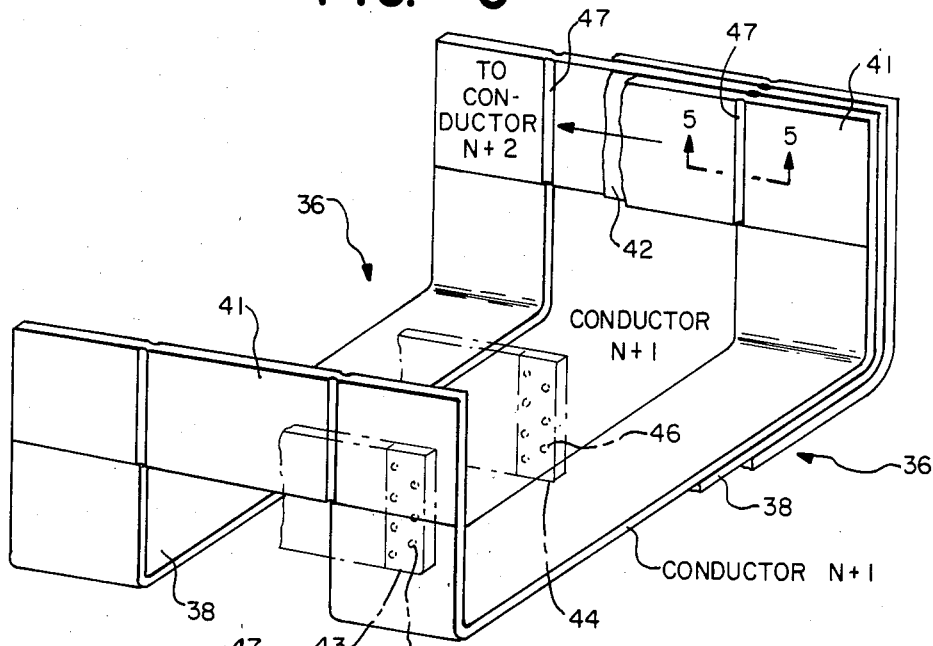
FIG.—4
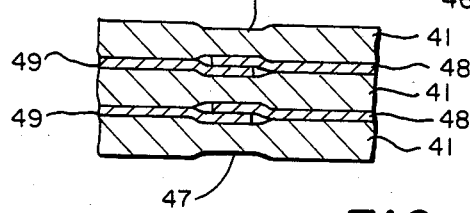
FIG.—5

MAGNET ASSEMBLY FOR MAGNETIC RESONANCE IMAGING AND METHOD OF MANUFACTURE

This invention relates to a magnet assembly and method of manufacture of the same for use with a magnetic resonance imaging apparatus.

Magnet structures have heretofore been provided for magnetic resonance imaging apparatus. However, they have suffered from numerous difficulties. For example, many have required the use of super conductors. This makes the magnet structures very expensive. Even where resistive magnet structures are utilized, it has been difficult to obtain high conductor packing efficiencies. In addition, the magnet structures heretofore utilized have required coil winding techniques requiring the use of skilled labor. In addition, typically it has been necessary to utilize wet thermosetting resins and to impregnate the coils under a vacuum in order to assure mechanical rigidity and insulating integrity. There is therefore a need for a new and improved magnet assembly and method of manufacture of the same which overcomes these disadvantages.

In general, it is an object of the present invention to provide a magnet assembly for magnetic resonance imaging and method of manufacture which uses a resistive type magnet.

Another object of the invention is to provide a magnet assembly and method of the above character which makes it possible to utilize a dry insulating material.

Another object of the invention is to provide a magnet assembly and method of the above character which does not require the use of wet thermosetting materials or the use of a vacuum for impregnation of the wet thermosetting materials.

Another object of the invention is to provide a magnet assembly and method of the above character in which a high conductor packing density is achieved.

Another object of the invention is to provide a magnet assembly and method of the above character which makes possible the use of all dry components during assembly.

Another object of the invention is to provide a magnet assembly and method of the above character in which relatively unskilled labor can be utilized.

Another object of the invention is to provide a magnet assembly and method of the above character in which shims are utilized to obtain the desired uniformity in the magnetic field.

Additional objects and features of the invention will appear from the following description in which the preferred embodiment is set forth in detail in conjunction with the accompanying drawings.

FIG. 1 is an isometric view of a magnet assembly incorporating the present invention.

FIG. 2 is a cross sectional view taken along the line 2—2 of FIG. 1.

FIG. 3 is a cross sectional view taken along the line 3—3 of FIG. 1.

FIG. 4 is an isometric view showing a partial assembly of a coil assembly utilized in the magnet assembly shown in FIG. 1.

FIG. 5 is a cross-sectional view taken along the line 5—5 of FIG. 4.

In general the magnet assembly of the present invention is comprised of a magnet yoke formed of a magnetic material and providing a generally rectangular opening extending therethrough and having first and second spaced apart pole faces facing each other. First and second saddle-shaped coil assemblies are disposed in the opening in the yoke. Each of the coil assemblies is comprised of first and second spaced apart generally parallel bundles of nested U-shaped members formed of a conducting material. The U-shaped members of the bundles have legs at opposite ends of the bundles. First and second sets of cross pieces are provided which are bonded by suitable means such as welding to the legs of the U-shaped members to form a continuous conductor in each bundle. A dry insulating material in the form of a B-stage epoxy glass is disposed between the U-shaped members and the cross pieces.

More in particular, the magnet assembly 11 is of a picture-frame type and is comprised of a magnet yoke 12 and upper and lower saddle-shaped coil assemblies 13 and 14. The yoke 12 consists of top and bottom slabs 16 and 17 and side slabs 18 and 19. The slabs 16, 17, 18 and 19 are formed of a suitable magnetic material such as a low carbon steel which has high magnetic permeability, low magnetic hysteresis and therefore low magnetic coercivity. As can be seen, the magnet yoke 12 has a rectangular configuration. The slabs 16, 17, 18 and 19 are fastened together into a unitary assembly by suitable means such as bolts 21 which extend through the slabs. However, it should be appreciated that magnetic forces are also relied upon to hold the slabs together rather than the bolts. By means of spacing slabs 16, 17 from 18, 19 with thin shim material (not shown) disposed along the inner edges of slabs 18, 19, the magnetic forces may be used to minimize the distortion of the magnet gap under the influence of the same magnetic forces. The slabs 16, 17, 18 and 19 can have suitable dimensions as, for example, the slabs 16 and 17 can have a width such as 34 inches, a length of 84 inches and a depth of 9½ inches. The side slabs 18 and 19 can have a height of 24 inches, a length of 34 inches and a depth of 9½ inches.

The inner surfaces of the top slab 16 and the bottom slab 17 provide substantially planar parallel pole faces 23 and 24 which face each other. Suitable shimming means is provided for the pole faces 23 and 24 to provide a uniform magnetic field and by way of example can take the form of a pair of spaced apart and parallel outer shims 26 and a pair of spaced apart parallel inner shims 27 which are parallel to the outer shims 26. Shimming is also provided by recesses 28 formed in the pole faces which are generally rectangular in cross section extending across the pole faces and parallel to and between the outer and inner shims 26 and 27. An upper gradient structure 31 is secured to the outer shims 26 and 27 and overlies the pole face 23 and similarly, a lower gradient structure 32 is secured to the outer and inner shims 26 and 27 and overlies the pole face 24. The upper and lower gradient structures 31 and 32 are of the type described in co-pending application Ser. No. 768,873, filed Aug. 23, 1985.

The coil assemblies 13 and 14 are formed in the manner shown in FIG. 4. Coil assembly 13 as shown in FIG. 4 consists of a pair of spaced apart bundles 36 formed of nested U-shaped members 38 having legs at opposite ends. Cross pieces 41 are utilized for innerconnecting the U-shaped members of the bundles so that each bundle forms a single conductor. Each of the U-shaped members 38 which form a pair of the bundles can be of a suitable size formed of a suitable material. Thus, by way of example, the members 38 can be formed of suitable sheet aluminum such as aluminum alloy number 1350 having a width of 11 inches and a thickness of 0.194 inches. The cross pieces 41 also can be formed of the same material and have the same cross sectional dimensions. The cross pieces 41 can be secured to the upper extremities of the U-shaped members 38 by suitable means such as welding.

The required insulation between the U-shaped members 38 and the cross pieces 41 provided by dry sheets 42 of insulating material. This dry insulating material can take any suitable form. However, it has been found that a fiber glass reinforced epoxy resin such as a fiberglass cloth pre-impregnated with a B-stage thermosetting epoxy resin sold as "Prepreg" can be used. It is a dry material having a thickness which varies from 0.005 to 0.007 inches. The use of this material is advantageous in forming the upper and lower coil assemblies 13 and 14 because it can be used in a dry condition by inserting the dry sheets between the U-shaped members 38 and the cross pieces 41. This eliminates the need for a wet epoxy and also the need for vacuum impregnation of the epoxy.

Typically in fabricating a coil assembly, the U-shaped members 38 are bent into the desired shapes. When ready to assemble, the members 38 for each bundle are nested within each other with Prepreg insulating material laid therebetween. As the U-shaped members 38 are nested with the insulating layers, the cross pieces or links 41 are welded in place to the legs of the U-shaped members 38 as shown in FIG. 4. Prepreg insulating material is also placed between the cross pieces 41.

In fabricating the upper and lower coil assemblies 13 and 14 it is necessary that a continuous current path be provided in each of the coil assemblies between the two terminals 43 and 44 provided for each of the coil assemblies. Thus the cross piece or link 41 in the forward portion of FIG. 4 is bonded to the leg portions of the n+1 conductors 38 of the two bundles 36. The cross piece or link 41 in the rear portion of FIG. 4 is bonded to the leg portion of the n+1 conductor of the right hand bundle 36 and to the leg portion of the n+2 conductor. This pattern is continued for the other of the U-shaped members 38 and cross pieces 41 to establish continuous current path from one terminal 43 to the other terminal 44. The terminals 43 and 44 are provided with two rows of connecting holes 46.

An indentation 47 is made at both ends and on both sides of the cross pieces 41 using a suitable die or by machining. The indentation has a depth equal to ½ the thickness of the "Prepreg" material and provides a place where the "Prepreg" sheet 48 from the u-shaped bundles may overlap the "Prepreg" sheets 49 from the cross pieces 41. This ensures good electrical insulation without causing excessive build up of prepreg thickness at these locations.

The upper and lower coil assemblies 13 and 14 are mounted within the magnet yoke 12 in the manner shown in FIG. 1. The construction which is shown in FIG. 4 can be utilized for the upper coil assembly 13. For the lower coil assembly 14, the terminals 43 and 44 are provided on the opposite ends of the cross links 41 in the forward portion of the view as shown in FIG. 4. With the upper and lower coil assemblies 13 and 14 installed in the magnet yoke 12, a large rectangular opening 50 is provided which extends through the magnet structure 11 and which is sufficiently large to receive large objects such as human bodies for imaging.

Heat sinks are provided for withdrawing heat energy from the upper and lower coil assemblies 13 and 14. The heat sinks can take any suitable form, for example, they can take the form of elongate tubing 51 formed of suitable material such as aluminum which is bonded to the exterior surfaces of the upper and lower coil assemblies 13 and 14. Thus by way of example four heat sinks can be provided for the exterior surfaces of the cross links 41 and eight heat sinks for the exterior surfaces of the pairs of bundles 36 for a total of twelve heat sinks for each of the coil assemblies 13 and 14. The tubing 51 which forms the heat sinks can be connected to a suitable supply of a cooling liquid as, for example, cooling water.

The magnet assembly or structure 11 hereinbefore described can be utilized in magnetic resonance imaging systems and apparatus for forming high resolution images. The use of magnet assembly 11 is particularly advantageous in such applications in contrast to the use of superconducting magnets. Since the magnetic flux is largely confined within the iron yoke assembly, there is a much lower level of magnetic field fringing into the surrounding area and affecting sensitive equipment or making dangerous projectiles of ferromagnetic items. The sensitive field region used for imaging is isolated within the air gap of the yoke structure and therefor is much less affected by large ferromagnetic objects such as by building reinforcement members, passing trucks, etc.

The magnet assembly 11 is relatively compact because of its resistive type magnet construction. It does not require the use of super conductivity but rather can be cooled by the use of liquids flowing through tubing bonded to the coil assemblies of the magnet assembly. The compactness and cooling efficiency is attributable to the configuration of the upper and lower coil assemblies 13 and 14 and to the fact that a very thin insulating material in the form of the Prepreg material has been utilized. The magnet structure is also one which can be readily assembled because of the use of the dry insulating material and also because of the elimination of a requirement for impregnating the coil assembly under a vacuum. The conductors, because of their rectangular configuration, can be formed with great precision thereby allowing the use of thin insulating material between individual turns of the coil. Also the use of rectangular conductors in the U-shaped or saddle-shaped upper and lower coil assemblies provides a high conductor packing density with a minimum utilization space. The construction is also one which can be accomplished by relatively unskilled labor.

What is claimed is:

1. In a magnet assembly, a magnet yoke formed of a magnet material and providing a generally rectangular opening and having first and second spaced apart parallel pole faces which are facing each other, first and second coil assemblies disposed in the opening in the yoke, each coil assembly comprising first and second spaced apart generally parallel bundles of nested U-shaped members formed of conducting material, the bundles having legs at opposite ends, first and second sets of cross pieces bonded to the legs of the U-shaped members and insulating material disposed between the U-shaped members and the cross pieces so that the bonded together U-shaped members and the cross pieces form a continuous current conductor for each coil assembly.

2. A magnet assembly as in claim 1 together with heat sinks bonded to the exterior surfaces of the coil assemblies.

3. A magnet assembly as in claim 2 wherein the heat sinks are in the form of tubes secured to the exterior surfaces of the coil assemblies.

4. A magnet assembly as in claim 1 wherein said U-shaped members and said cross pieces have a rectangular cross section.

5. A magnet assembly as in claim 1 wherein said insulating material is in the form of a B-stage epoxy glass material.

6. A magnet assembly as in claim 1 together with shims carried by the pole faces.

7. A magnet assembly as in claim 6 wherein said shims are in the form of spaced apart and parallel outer and inner shim members with recesses disposed between the inner and outer shim members.

8. In a method of assembly for a magnet assembly, forming a plurality of U-shaped members of a conducting material so that they can nest in each other, providing a plurality of cross pieces, providing sheets of an insulating material formed of a B-stage epoxy glass, assembling the U-shaped members in a nested fashion with the sheets of insulating material disposed between the same to provide two sets of bundles, bonding cross pieces to the bundles with insulating material therebetween so that there is provided a continuous conductor for first and second coil assemblies and mounting the first and second coil assemblies in a magnet yoke to provide a magnet assembly.

* * * * *